United States Patent
Jung et al.

(10) Patent No.: US 7,971,088 B2
(45) Date of Patent: Jun. 28, 2011

(54) CLOCK SKEW CONTROLLER AND INTEGRATED CIRCUIT INCLUDING THE SAME

(75) Inventors: Gun-Ok Jung, Yongin-si (KR); Chung-Hee Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 601 days.

(21) Appl. No.: 12/071,635

(22) Filed: Feb. 25, 2008

(65) Prior Publication Data

US 2008/0204103 A1 Aug. 28, 2008

(30) Foreign Application Priority Data

Feb. 27, 2007 (KR) .................. 10-2007-0019792

(51) Int. Cl.
*G06F 1/04* (2006.01)
(52) U.S. Cl. ........................................ 713/503; 713/401
(58) Field of Classification Search .................. 713/400, 713/401, 500, 503; 327/292
See application file for complete search history.

(56) References Cited

U.S. PATENT DOCUMENTS

| | | | |
|---|---|---|---|
| 5,628,000 A | 5/1997 | Kashiyama et al. | |
| 6,005,425 A * | 12/1999 | Cho | 327/156 |
| 6,259,330 B1 * | 7/2001 | Arai | 331/57 |
| 6,686,785 B2 * | 2/2004 | Liu et al. | 327/158 |
| 6,750,692 B2 * | 6/2004 | Jang | 327/291 |
| 6,993,109 B2 * | 1/2006 | Lee et al. | 375/376 |
| 7,002,358 B2 * | 2/2006 | Wyatt | 324/622 |
| 7,023,252 B2 * | 4/2006 | Schultz | 327/161 |
| 7,123,525 B2 * | 10/2006 | Lin et al. | 365/194 |
| 7,174,475 B2 * | 2/2007 | Lee et al. | 713/503 |
| 7,245,684 B2 * | 7/2007 | Adkisson | 375/359 |
| 7,301,385 B2 * | 11/2007 | Takano et al. | 327/292 |
| 2004/0017242 A1 * | 1/2004 | Lee | 327/293 |
| 2004/0128579 A1 * | 7/2004 | Khondker et al. | 713/500 |
| 2004/0150438 A1 * | 8/2004 | Jung et al. | 327/119 |
| 2007/0283128 A1 | 12/2007 | Hoshaku | |
| 2008/0036509 A1 | 2/2008 | Jang | |
| 2008/0115004 A1 * | 5/2008 | Braun et al. | 713/401 |

FOREIGN PATENT DOCUMENTS

| | | |
|---|---|---|
| JP | 07-262237 | 10/1995 |
| JP | 10-063367 | 3/1998 |
| KR | 10-1999-003935 | 1/1999 |
| KR | 10-2001-0065679 A | 7/2001 |
| KR | 10-2002-0071183 A | 9/2002 |
| KR | 10-2004-0031343 A | 4/2004 |
| KR | 10-0763849 B1 | 9/2007 |
| KR | 10-2007-0116740 A | 12/2007 |

* cited by examiner

*Primary Examiner* — Khanh Dang
(74) *Attorney, Agent, or Firm* — Lee & Morse, P.C.

(57) ABSTRACT

A clock skew controller for adjusting a skew between a first clock, which is input to a first clock mesh, and a second clock mesh input to a second clock mesh, includes a pulse generator adapted to output a pulse signal corresponding to a delay time between a first output clock output from the first clock mesh and a second output clock output from the second clock mesh, a pulse width detector adapted to generate a digital signal corresponding to a pulse width of the pulse signal, and a clock delay adjuster adapted to delay one of the first and second clocks by a time corresponding to the digital signal.

15 Claims, 9 Drawing Sheets

CLOCK SKEW CONTROLLER AND INTEGRATED CIRCUIT INCLUDING THE SAME

BACKGROUND OF THE INVENTION

1. Field of the Invention

Embodiments of the invention disclosed herein relate to integrated circuits synchronized with clocks. In particular, embodiments of the invention disclosed herein relate to integrated circuits including controllers capable of correcting clock skews.

2. Description of the Related Art

Semiconductor integrated circuits generally include many electronic device components such as transistors, diodes, inverters, and so on. Those electronic components are operatively interconnected with each other to constitute structures (e.g., gates, cells, memory units, operation units, controllers, decoders, and so on) of large scale circuits. Integrated circuits also include a plurality of conductive layers, such as metal and/or polysilicon lines, for interconnecting the electronic devices and circuit components.

For reliable operations of the integrated circuits, all the electronic devices and circuit components should be operable in sync with each other. Clock signals are used for synchronizing the electronic devices and circuit components. Typically, clock signals are oscillating signals, which are required to have very small skews so as to maintain synchronization among various circuit components. However, even if a plurality of different circuits are connected to a same clock source, characteristics of clock distribution lines, e.g., length of clock distribution line, may cause a clock skew.

With developments of semiconductor technology, operating frequencies of microprocessors are becoming higher, and thus, managing clock skew is more important. For the purpose of lessening troubles of clock skews, most integrated circuits employ special clock distribution networks. A mesh-type clock network may be helpful in reducing a clock skew, but such a network may dissipate a relatively high amount of power. Thus, in some cases, a plurality of clock meshes are employed.

However, in a distribution network structure including a plurality of clock meshes, while the clock skew may be very small in each mesh, there may be problems due to an imbalance of the clock skews between or among the plurality of clock meshes.

SUMMARY OF THE INVENTION

Embodiments of the invention are therefore directed to a clock skew controller and an integrated circuit including such a clock skew controller, which substantially overcome one or more of the problems due to the limitations and disadvantages of the related art.

It is therefore a feature of an embodiment of the invention to provide a clock skew controller capable of minimizing clock skews among a plurality of clock meshes.

It is therefore another feature of an embodiment of the invention to provide an integrated circuit including a clock skew controller capable of minimizing clock skews among a plurality of clock meshes.

At least one of the above and other features and advantages of the invention may be realized by providing a clock skew controller adapted to adjust a skew between a first clock, which is input to a first clock mesh, and a second clock mesh input to a second clock mesh, including a pulse generator adapted to output a pulse signal corresponding to a delay time between a first output clock output from the first clock mesh and a second output clock output from the second clock mesh, a pulse width detector adapted to generate a digital signal corresponding to a pulse width of the pulse signal, and a clock delay adjuster adapted to delay one of the first and second clocks by a time corresponding to the digital signal.

The pulse generator may include a first inverter adapted to inverse the second output clock, and a logic circuit adapted to receive the first output clock and a signal inversed from the second output clock by the first inverter and to output the pulse signal. The pulse width detector may include pluralities of first delay units connected in series, the first delay units delaying the pulse signal, and pluralities of first flipflops respectively corresponding to the first delay units, the first flipflops adapted to latch corresponding outputs of the first delay units in sync with the pulse signal and to output the digital signal. The clock skew controller may include a phase detector adapted to activate a detection signal when the first output clock is earlier than the second output clock in phase.

The pulse width detector may include a register circuit adapted to store the digital signal in sync with the detection signal. The pulse width detector may include an output circuit adapted to output the digital signal to the clock delay adjuster in sync with the detection signal. The pulse width detector may include pluralities of second flipflops respectively corresponding to the first flipflops, the second flipflops respectively latching corresponding outputs of the first flipflops in sync with the detection signal. The pulse width detector may include pluralities of third flipflops respectively corresponding to the second flipflops, the third flipflops respectively latching corresponding outputs of the second flipflops in sync with the detection signal.

Each of the second flipflops may be associated with a corresponding one of the third flipflops to form corresponding pairs of the second and third flipflops, and the clock skew controller may include pluralities of comparators respectively corresponding to the pairs of the second and third flipflops, the comparators adapted to output a comparison signal based on whether the outputs of the second flipflops are identical to outputs of the third flipflops, and pluralities of fourth flipflops respectively corresponding to the comparators, the fourth flipflops respectively latching corresponding outputs of the comparators in sync with the detection signal.

The clock delay adjuster may delay the first clock by a time corresponding to the digital signal. The clock delay adjuster may include a selection signal generator adapted to output pluralities of selection signals corresponding to signals output from the fourth flipflops, pluralities of second delay units connected in series, delaying a reference clock, and a clock delay selector receiving the reference clock and outputs of the second delay units and adapted to output the first clock based on one of the reference clock and the outputs of the second delay units according to the selection signals.

The second delay units may correspond to the first delay units in delay times. The phase detector may include a PMOS transistor connected between a power source voltage and a first node and controlled by the first output clock, a second inverter logically inversing the second output clock, a first NMOS transistor connected between the first node and a second node and controlled by an output of the second inverter, a second NMOS transistor connected between the second node and a ground voltage and controlled by the first output clock, a delay circuit delaying the output of the second inverter, a flipflop latching a signal inversed from an output of the first node in sync with an output of the delay circuit, and a logic circuit adapted to receive an output of the flipflop and the second output clock and to output the detection signal.

At least one of the above and other features and advantages of the invention may be realized by providing an integrated circuit, including a first clock mesh receiving a first clock, a second clock mesh receiving a second clock, a pulse generator adapted to output a pulse signal corresponding to a delay time between a first output clock output from the first clock mesh and a second output clock output from the second clock mesh, a pulse width detector adapted generate a digital signal corresponding to a pulse width of the pulse signal, and a clock delay adjuster adapted to delaying one of the first and second clocks by a time corresponding to the digital signal.

The pulse generator may include a first inverter adapted to inverse the second output clock, and a logic circuit adapted to receive the first output clock and a signal inversed from the second output clock by the first inverter and to output the pulse signal. The pulse width detector may include pluralities of first delay units connected in series, delaying the pulse signal, and pluralities of first flipflops respectively corresponding to the first delay units, the first flipflops adapted to latch corresponding outputs of the first delay units in sync with the pulse signal and to output the digital signal.

The integrated circuit may include a phase detector activating a detection signal when the first output clock is earlier than the second output clock in phase. The pulse width detector may include an output circuit adapted to output the digital signal to the clock delay adjuster in sync with the detection signal.

At least one of the above and other features and advantages of the invention may be realized by providing an integrated circuit including a first clock mesh receiving a first clock, a second clock mesh receiving a second clock, a delay detector outputting a digital signal in correspondence with a delay time between a first output clock output from the first clock mesh and a second output clock output from the second clock mesh, and a clock delay adjuster delaying one of the first and second clocks by a time corresponding to the digital signal.

The delay detector may include pluralities of first delay units connected in series, receiving the first output clock, pluralities of second delay units serially connected in correspondence with the first delay units, receiving the second output clock, pluralities of logic gates adapted to respectively output corresponding delay signals from outputs of the first and second delay units, and pluralities of flipflops respectively latching corresponding signals output from the logic gates in response to the second output clock.

The delay detector may be adapted to output a first delay control signal corresponding to the delay time between the first output clock and the second output clock when the first output clock is earlier than the second output clock and to output a second delay control signal corresponding to the delay time between the first output clock and the second output clock when the second output clock is earlier than the first output clock, and the clock delay adjuster may include a first clock delay adjuster adapted to delay the first clock by a time corresponding to the first delay control signal and a second clock delay adjuster adapted to delay the second clock by a time corresponding to the second delay control signal.

A further understanding of the nature and advantages of the present invention herein may be realized by reference to the remaining portions of the specification and the attached drawings.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
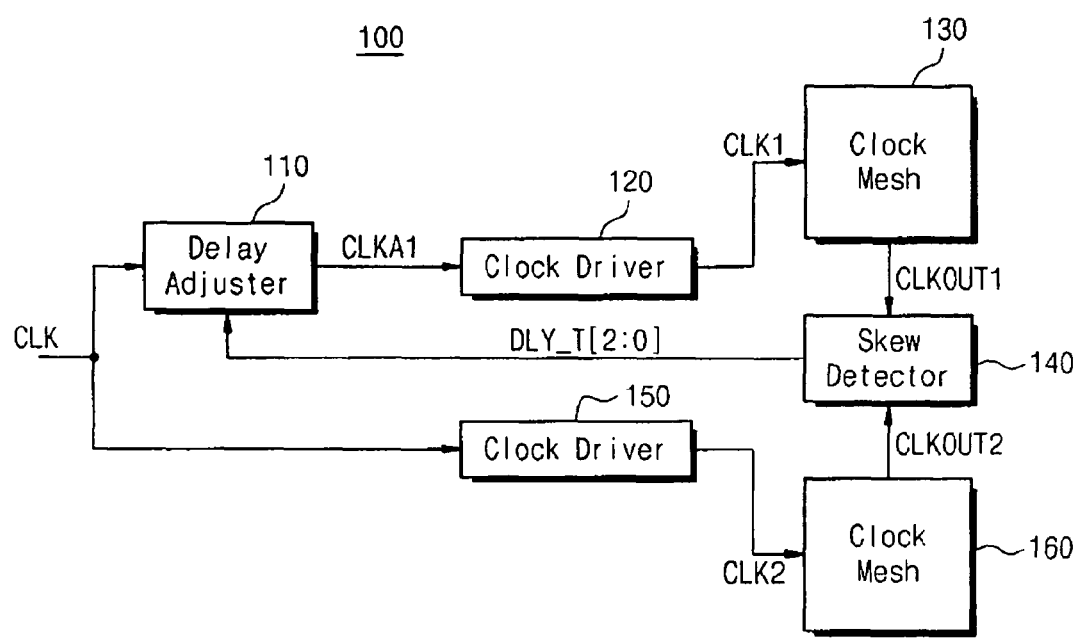
FIG. 1 illustrates a block diagram of an integrated circuit according to an exemplary embodiment of the invention.

Korean Patent Application No. 10-2007-19792, filed on Feb. 27, 2007, in the Korean Intellectual Property Office, and entitled: "Clock Skew Controller and Integrated Circuit Including the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "between" two elements, it can be the only element between the two elements, or one or more intervening elements may also be present. Like reference numerals refer to like elements throughout the specification.

FIG. 1 illustrates a block diagram of an integrated circuit 100 according to an exemplary embodiment of the invention.

Referring to FIG. 1, the integrated circuit 100 may include a clock skew controller that includes a delay adjuster 110, clock drivers 120 and 150, a skew detector 140, and clock meshes 130 and 160.

The delay adjuster 110 may output a clock CLKA1 after adjusting a delay time of a reference clock CLK in response to a delay control signal DLY_T[2:0]. The clock driver 120 may receive the clock CLKA1 from the delay adjuster 110 and provide a first clock CLK1 to the clock mesh 130. The clock driver 150 may receive the reference clock CLK and provide a second clock CLK2 to the clock mesh 160. The clock mesh 130 may act as a clock network for supplying the first clock CLK1 to peripheral circuits (not shown). The clock mesh 160 may act as a clock network for supplying the second clock CLK2 to peripheral circuits (not shown). The skew detector 140 may operate to detect a skew between first and second output clocks CLKOUT1 and CLKOUT2 respectively output from the clock meshes 130 and 160, the skew detector 140 may output the delay control signal DLY_T[2:0].

In some embodiments, as shown, e.g., in FIG. 1, the integrated circuit 100 may adjust a delay time of the clock signal CLKA1 in accordance with the delay control signal DLY_T[2:0]. The clock signal CLKA1 adjusted by the delay adjuster 110 may be supplied to the clock mesh 130. The delay control signal DLY_T[2:0] may correspond to a skew between the first and second output clocks CLKOUT1 and CLKOUT2 output from the clock meshes 130 and 160. That is, the clock meshes 130 and 160 may respectively output first and second output clocks CLKOUT1 and CLKOUT2. Some embodiments of the invention may thereby enable a skew between the clock meshes 130 and 160 to be reduced and/or eliminated.

Figure 2:
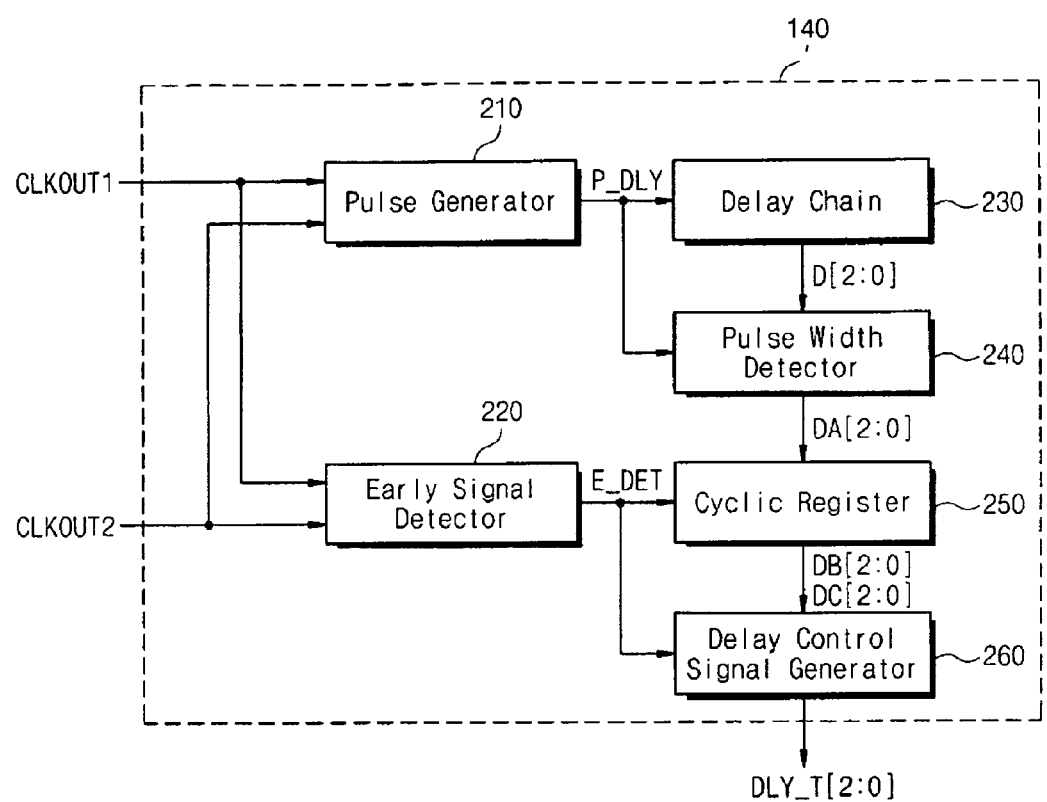
FIG. 2 illustrates a block diagram of the skew detector illustrated in FIG. 1 according to an exemplary embodiment of the invention.

FIG. 2 illustrates a block diagram of the skew detector 140 illustrated in FIG. 1 according to an exemplary embodiment of the invention. Referring to FIG. 2, the skew detector 140 may include a pulse generator 210, an early signal detector 220, a delay chain 230, a pulse width detector 240, a cyclic register 250, and a delay control signal generator 260.

The pulse generator 210 may receive the first and second output clocks CLKOUT1 and CLKOUT2 from the clock meshes 130 and 160. The pulse generator 210 may generate a pulse signal P_DLY corresponding to a delay time between the first and second output clocks CLKOUT1 and CLKOUT2.

The delay chain 230 may receive the pulse signal P_DLY from the pulse generator 210. The delay chain 230 may output a plurality of delay signals D[2:0] by delaying the pulse signal P_DLY by predetermined times.

The pulse width detector 240 may receive the plurality of delay signals D[2:0] and the pulse signal P_DLY. The pulse width detector 240 may output first signals DA[2:0] in sync with the pulse signal P_DLY. The first signals DA[2:0] may be digital signals corresponding to a pulse width of the pulse signal P_DLY. The first signals DA[2:0] may be based on the delay signals D[2:0]

The early signal detector 220 may operate to detect whether the first output clock CLKOUT1 of the clock mesh 130 is earlier than the second output clock CLKOUT2 of the clock mesh 160. If the first output clock CLKOUT1 is earlier than the second output clock CLKOUT2, the early signal detector may activate a detection signal E_DET.

The cyclic register 250 may receive the first signals DA[2:0] and the detection signal E_DET. The cyclic register 250 may output second signals DB[2:0] that may be latched with the first signals DA[2:0] during a clock cycle in sync with the detection signal E_DET. The cyclic register 250 may output third signals DC[2:0] that may be latched with the second signals DB[2:0] during a clock cycle in sync with the detection signal E_DET.

The delay control signal generator 260 may receive the second and third signals DB[2:0] and DC[2:0]. The delay control signal generator 260 may output the delay control signal DLY_T[2:0] in sync with the detection signal E_DET.

The skew detector 140 may output the delay control signal DLY_T[2:0]. The delay control signal DLY_T[2:0] may be a digital signal corresponding to a delay time from the first output clock CLKOUT1 to the second output clock CLKOUT2 when the first output clock CLKOUT1 is earlier than the second output clock CLKOUT2. In some embodiments, because the cyclic register 250 and the delay control signal generator 260 may operate in sync with the detection signal E_DET, there may be no output from the cyclic register 250 and the delay control signal generator 260 unless the first output clock CLKOUT1 is earlier than the second output clock CLKOUT2, i.e., unless the detection signal E_DET is activated. Accordingly, a probability of malfunction in the skew detector 140 may be reduced and/or eliminated.

Figure 3:
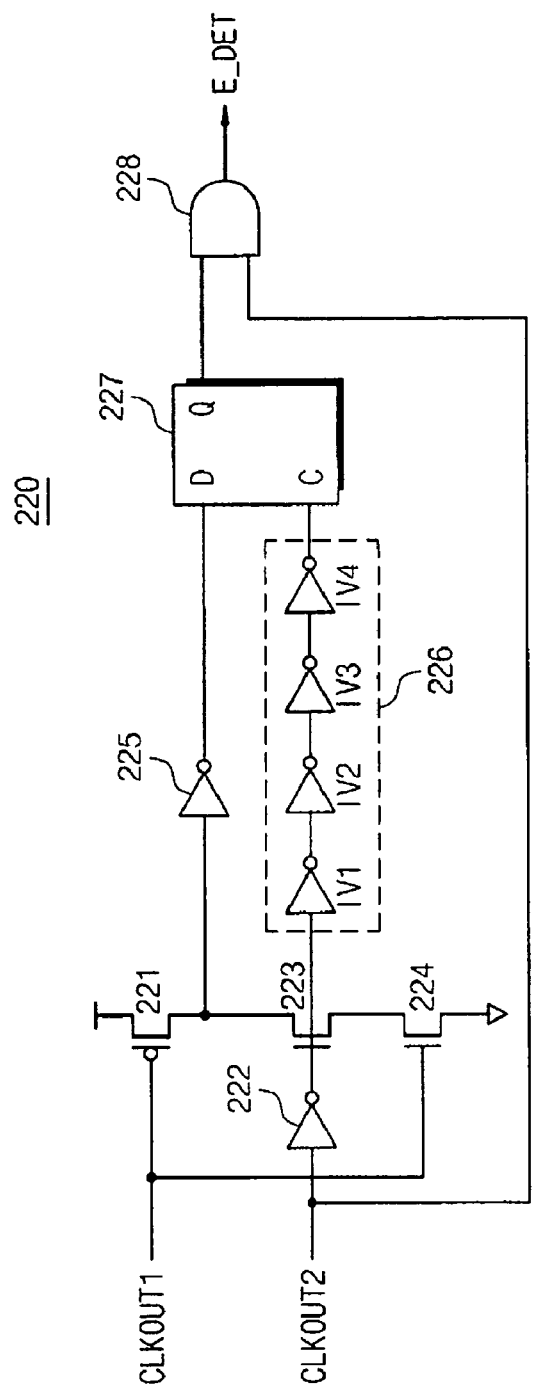
FIG. 3 illustrates a circuit diagram of the early signal detector illustrated in FIG. 2 according to an exemplary embodiment of the invention.

FIG. 3 illustrates a circuit diagram of the early signal detector illustrated in FIG. 2 according to an exemplary embodiment of the invention.

Referring to FIG. 3, the early signal detector 220 may include a PMOS transistor 221, NMOS transistors 223 and 224, inverters 222 and 225, a delay unit 226, a D-flipflop 227, and an AND gate 228. The PMOS and NMOS transistors, 221, 223, and 224, may be sequentially connected between a power source voltage and a ground voltage in series. Gates of the PMOS and NMOS transistors 221 and 224 may be coupled to the first output clock CLKOUT1. The inverter 222 may operate to inverse a logic level of the second output clock CLKOUT2. The NMOS transistor 223 may be controlled by an output of the inverter 222.

The inverter 225 may operate to inverse a logic level of a connection node between the PMOS and NMOS transistors 221 and 223. The delay unit 226 may include inverters IV1~IV4 connected in series. The delay unit 226 may delay an output of the inverter 222 by a predetermined time. The D-flipflop 227 may latch an output of the inverter 225 in sync with the second output clock CLKOUT2 inversed and delayed by the inverter 222 and the delay unit 226. The AND gate 228 may receive an output of the D-flipflop 227 and the second output clock CLKOUT2, and may output the detection signal E_DET based thereon.

An exemplary operation of the early signal detector 220 will be detailed below.

Figure 4:
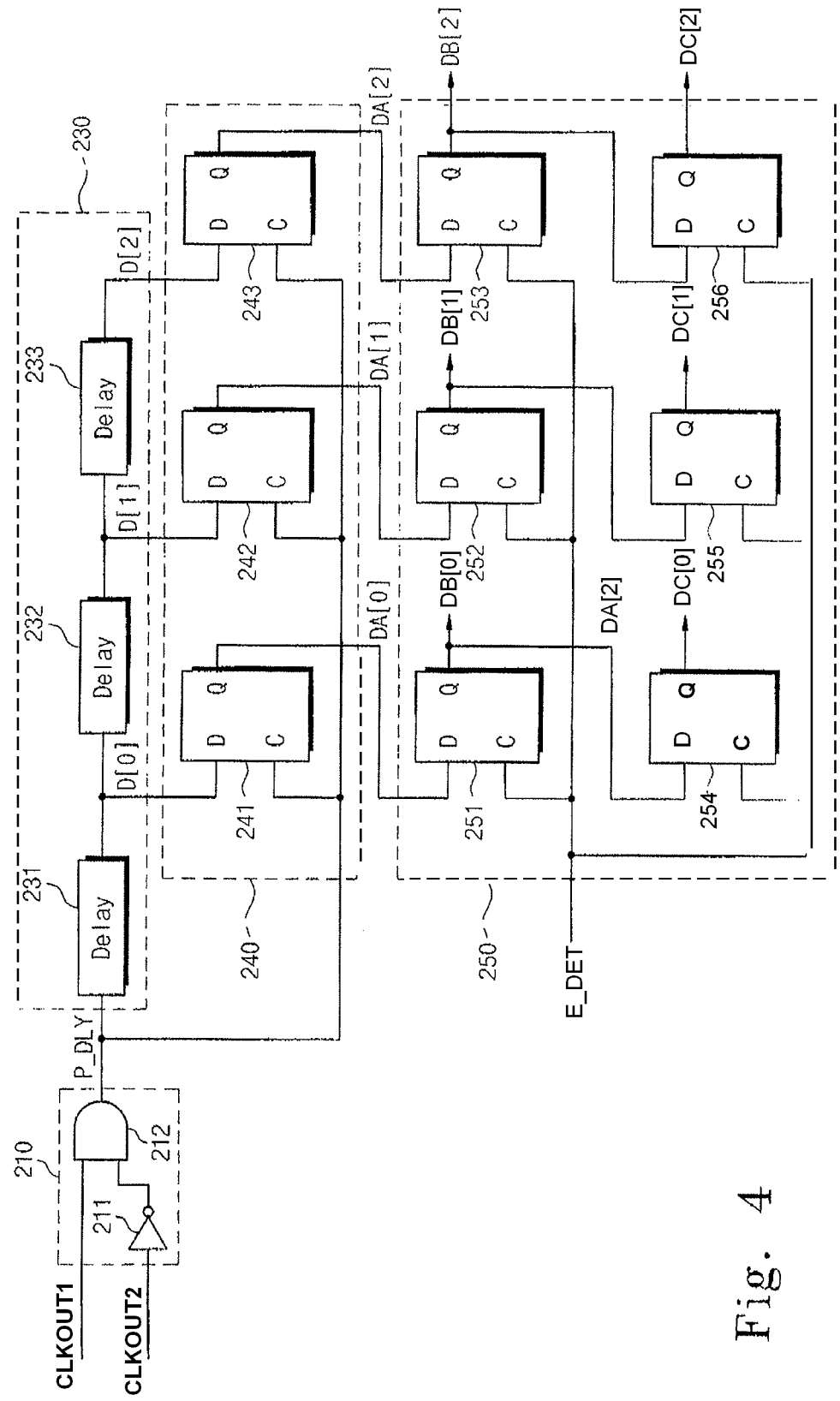
FIGS. 4 and 5 illustrate circuit diagrams of a portion of the skew detector illustrated in FIG. 2 according to an exemplary embodiment of the invention.
Figure 5:
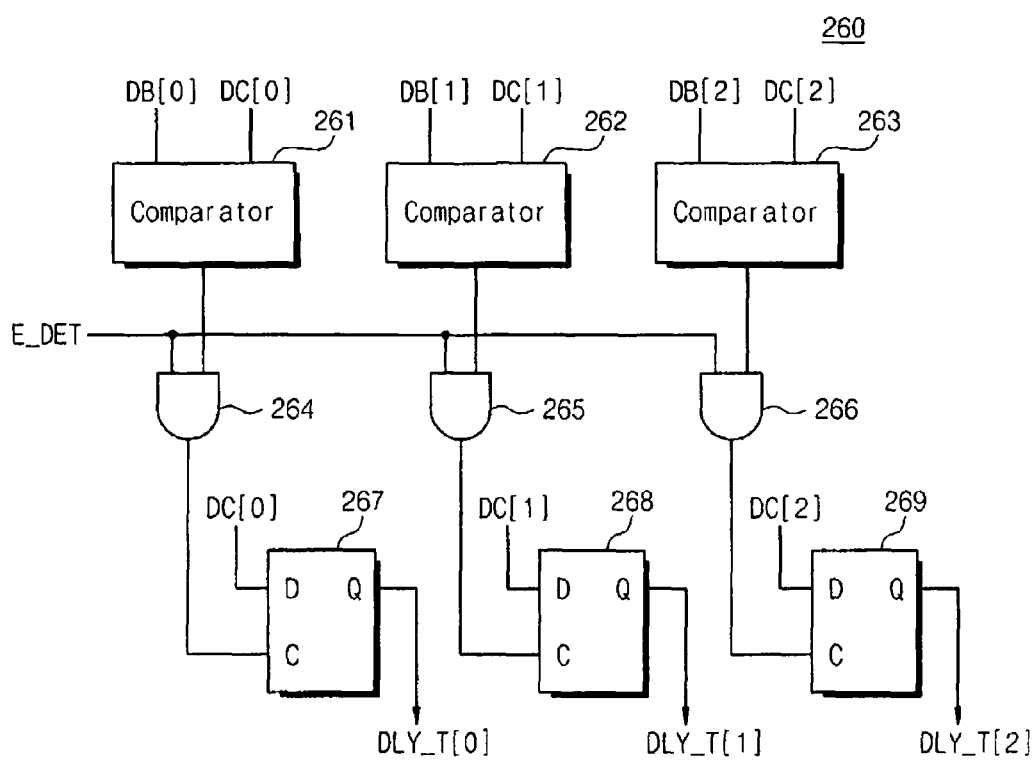

FIGS. 4 and 5 illustrate circuit diagrams of a portion of the skew detector 140 illustrated in FIG. 2 according to an exemplary embodiment of the invention. More particularly, FIG. 4 illustrates exemplary circuit diagrams of the pulse generator 210, the delay chain 230, the pulse width detector 240 and the cyclic register 250 of the skew detector 140 shown in FIG. 2.

Referring first to FIG. 4, the pulse generator 210 may include an inverter 211 and an AND gate 212. The inverter 211 may operate to inverse a logic level of the second output clock CLKOUT2. The AND gate 212 may output the pulse signal P_DLY based on a delay time of the inversed second output clock CLKOUT2 relative to the first output clock CLKOUT1.

The delay chain 230 may include n delay units 231, 232, 233 connected in series, where n in the exemplary embodiment illustrated in FIG. 4 is equal to three (3). The delay chain 230, and more particularly, e.g., the delay unit 231, may receive the pulse signal P_DLY. Each of the delay units 231, 232, 233 may respectively output the delay signals D[2:0] by delaying their input signals by predetermined times.

The pulse width detector 240 may include D-flipflops 241, 242, 243 corresponding each to the delay units 231, 232, 233, i.e., in some embodiments there may be a same number (n) of D-flipflops as delay units. The D-flipflops 241, 242, 243 may respectively receive the delay signals D[2:0] from the delay units 231, 232, 233 and the pulse signal P_DLY. The D-flipflops 241, 242, 243 may respectively output the first signals DA[2:0] based on the respective one of the delay signals D[2:0] in response to the pulse signal P_DLY.

The cyclic register 250 may include D-flipflops 251, 252, 253, 254, 255, 256. In some embodiments, the cyclic register 250 may include, e.g., 2n number of D-flipflops. Some, e.g., half, of the D-flipflops 251, 252, 253 may respectively receive the first signals DA[2:0] output from the D-flipflops 241, 242, 243, and may output the second signals DB[2:0] in sync with the detection signal E_DET. Others, e.g., the remaining half of the D-flipflops 254, 255, 256 may respectively receive the second signals DB[2:0] output from the other D-flipflops 251, 252, 253, and may output the third signals DC[2:0] in sync with the detection signal E_DET. The second and third signals DB[2:0] and DC[2:0] may be input to the delay control signal generator 260 from the D-flipflops 251, 252, 253, 254, 255, 256.

FIG. 5 illustrates an exemplary circuit diagram of the delay control signal generator 260 of the skew detector 140 shown in FIG. 2.

Referring to FIG. 5, the delay control signal generator 260 may include comparators 261, 262, 263, AND gates 264, 265, 266, and D-flipflops 267, 268, 269. In some embodiments, the delay control signal generator 260 may include n number of comparators, n number of AND gates and n number of D-flipflops. Each of the comparators 261, 262, 263 may determine whether the corresponding one of the second signals DB[0:2] and the corresponding one of the third signals DC[0:2] supplied thereto are identical to each other. For example, the comparator 261 may determine whether the second and third signals DB[0] and DC[0] supplied thereto by the corresponding pair of the D-flipflops 251 and 254 are identical to each other. The comparator 262 may determine whether the second and third signals DB[1] and DC[1] supplied thereto by the corresponding pair of the D-flipflops 252 and 255 are identical to each other. The comparator 263 may determine whether the second and third signals DB[2] and DC[2] supplied thereto by the corresponding pair of the D-flipflops 253 and 256 are identical to each other.

Each of the AND gates 264, 265, 266 may each receive the detection signal E_DET and an output signal from the respective one of the comparators 261, 262, 263 associated therewith, and may output a signal corresponding to the signals supplied thereto to a respective one of the D-flipflops 267, 268, 269 of the delay control signal generator 260. Each of the D-flipflops 267, 268, 269 may also receive a respective one of the third signals DC[2:0] from the corresponding one of the D-flipflops 254, 255, 256 of the cyclic register 250. The D-flipflops 267, 268, 269 may output the respective one of the delay control signals DLY_T[2:0] based on the third signals DC[2:0] in sync with the corresponding one of the outputs of the AND gates 264, 265, 266.

Figure 7:
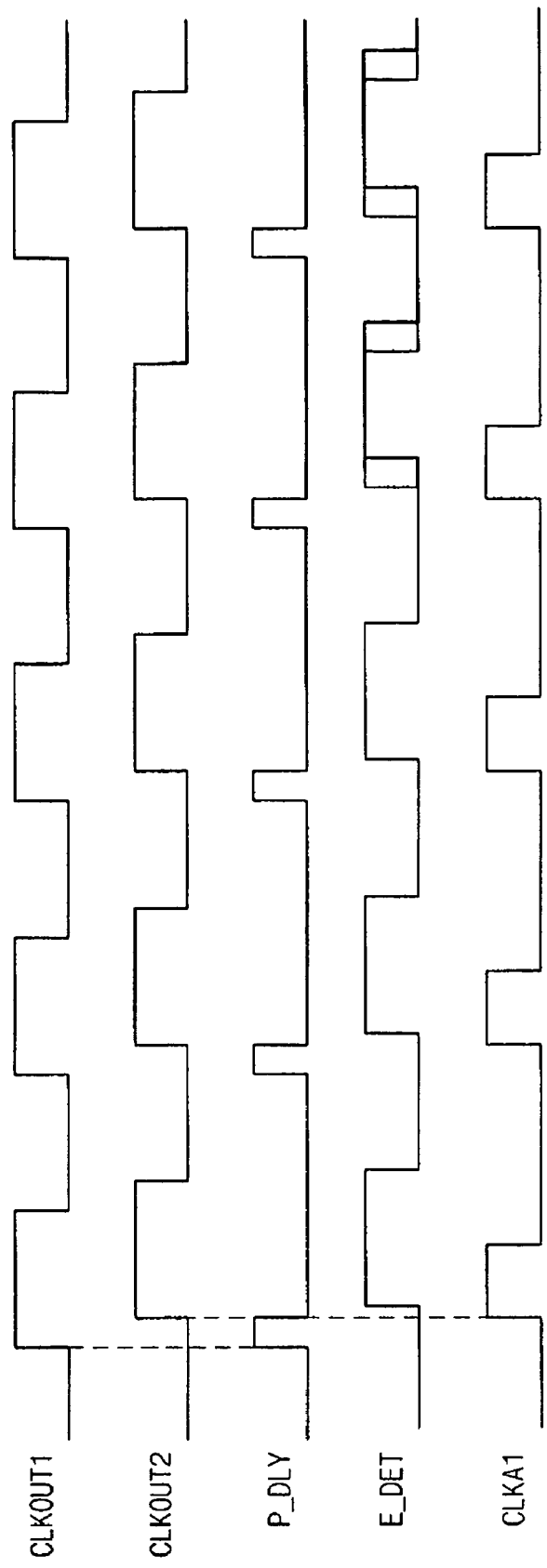
FIG. 7 illustrates a timing diagram of an exemplary operation for adjusting a phase of a clock according to an exemplary embodiment of the invention.

Referring to FIG. 7, an exemplary operation of the skew detector 140 illustrated in FIGS. 3 through 5 will be described. FIG. 7 illustrates a timing diagram of an exemplary operation for adjusting a phase of the clock CLKA1, which may be provided to the first clock mesh 130, in accordance with a delay time from the first output clock CLKOUT1 to the second output clock CLKOUT2.

Referring to FIG. 7, the pulse generator 210 illustrated in FIG. 4 may output the pulse signal P_DLY when the first output clock CLKOUT1 is earlier than the second output clock CLKOUT2. For example, assuming that delay times by the delay units 231, 232, 233 illustrated in FIG. 4 are 30 ps (30 picoseconds), the delay signals D[0], D[1], and D[2] output from the delay units 231, 232, 233 may be '1', '0', and '0', respectively, when the pulse width of the pulse signal P_DLY ranges from 30 ps to 60 ps. When the pulse width of the pulse signal P_DLY is from 60 ps to 90 ps, the delay signals D[0], D[1], and D[2] output from the delay units 231, 232, 233 may be '1', '1', and '0', respectively. When the pulse width of the pulse signal P_DLY is from 90 ps to 120 ps, the delay signals D[0], D[1], and D[2] output from the delay units 231, 232, 233 may be '1', '1', and '1', respectively. In such embodiments, the maximum pulse width of the pulse signal P_DLY is 120 ps. The D-flipflops 241, 242, 243 may respectively output the first signals DA[2:0] in sync with the pulse signal P_DLY.

Referring to FIGS. 4 and 7, if the first and second output clocks CLKOUT1 and CLKOUT2 are at low levels, an output of the inverter 225 (see FIG. 3) becomes low level. If the first output clock CLKOUT1 changes to a high level before of the second output clock CLKOUT2 changes from a low level to a high level, an output of the inverter 225 may go to a high level. When an output of the inverter 225 changes to a high level, the D-flipflop 227 may output a high level signal. When the second output clock CLKOUT2 goes to a high level, the detection signal E_DET may rise up to a high level.

If the first output clock CLKOUT1 is at a low level before and/or when the second output clock CLKOUT2 is at a high level, the detection signal E_DET may maintain a low level. In other words, the detection signal E_DET may turn to a high level only when the first output clock CLKOUT1 is earlier than the second output clock CLKOUT2, e.g., changes to a high level before the second output clock CLKOUT2 changes to a high level.

Referring to FIG. 4, the D-flipflops 251, 252, 253 may output the second signals DB[2:0] in sync with the detection signal E-DET. The D-flipflops 254, 255, 256 may output the third signals DC[2:0] in sync with the detection signal E-DET. In embodiments, if the detection signal E_DET maintains a low level, e.g., when the second output clock CLKOUT2 is earlier than the first output clock CLKOUT1, the D-flipflops 251, 252, 253, 254, 255, 256 may not operate.

Referring to FIG. 5, the delay control signal generator 260 may output the delay control signals DLY_T[2:0] when the second signals DB[2:0] output from the D-flipflops 251, 252, 253 match with the third signals DC[2:0] output from the D-flipflops 254, 255, 256. In other words, the delay control signals DLY_T[2:0] may be output only when pulse widths of the pulse signal P_DLY are the same during two (2) clock cycles. As a result, a malfunction that delays the clock signal CLKA1 due to a transient skew generated between the first and second output clocks CLKOUT1 and CLKOUT2 output from the clock meshes 130 and 160 may be prevented. Although a delay time of two (2) clock cycles is described above, a delay time by the cyclic register 250 is variable. Embodiments of the invention are not limited to two (2) clock cycles.

Referring to FIGS. 4 and 7, owing to the delay of one (1) clock cycle by the pulse width detector 240 and the delay of two (2) clock cycles by the cyclic register 250, the clock signal CLKA1 may be adjusted in phase after three (3) clock cycles after the first and second output clocks CLKOUT1 and CLKOUT2 are output.

Figure 6:
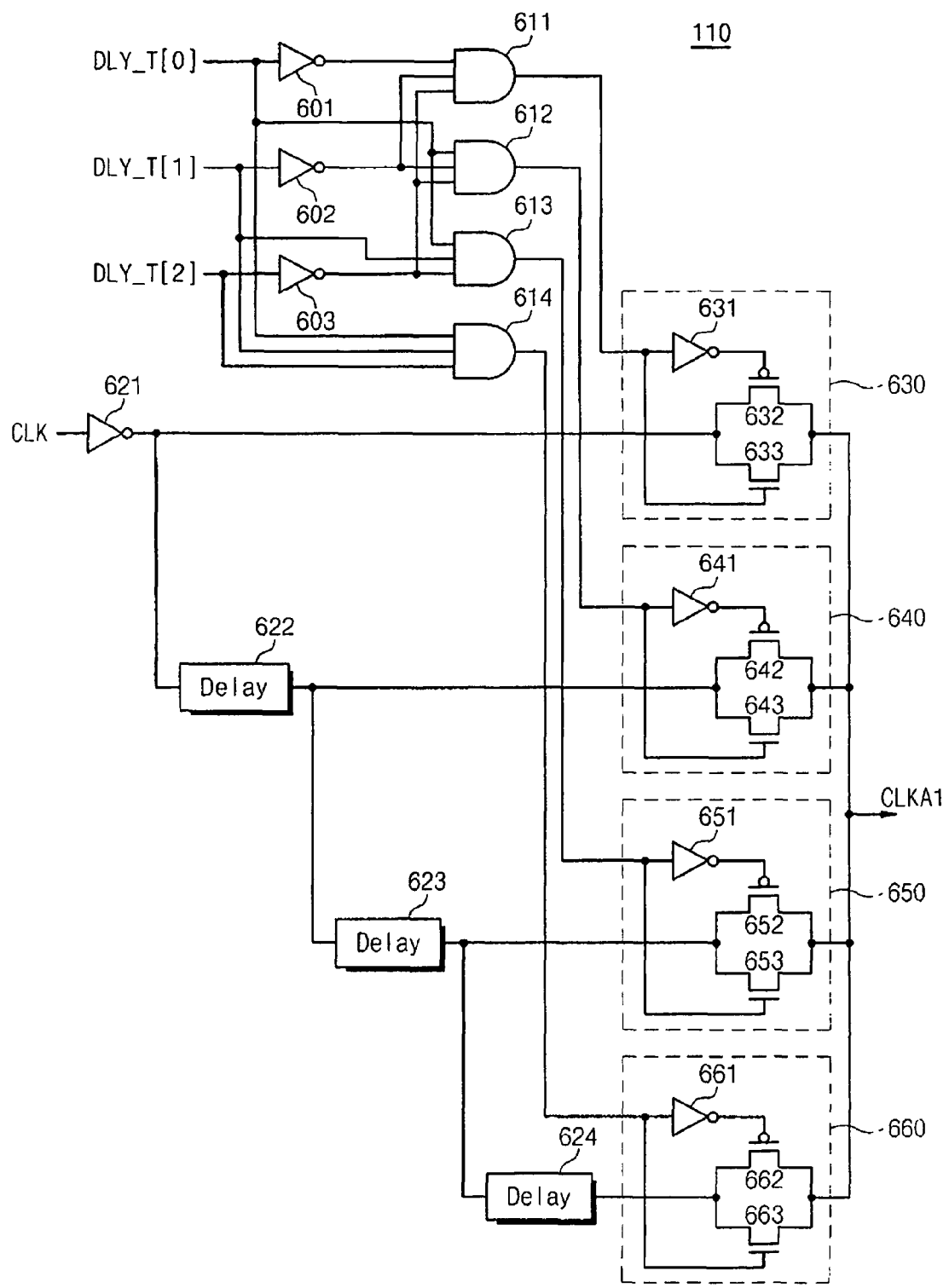
FIG. 6 illustrates a circuit diagram of the delay adjuster illustrated in FIG. 1 according to an exemplary embodiment of the invention.

FIG. 6 illustrates a circuit diagram of the delay adjuster 110 illustrated in FIG. 1 according to an exemplary embodiment of the invention.

Referring to FIG. 6, the delay adjuster 110 may include a plurality of inverters 601, 602, 603 and 621, AND gates 611, 612, 613, 614, delay units 622, 623, 624, and output circuits 630, 640, 650, 660. The inverters 601, 602, 603 may receive the delay control signals DLY_T[2:0] output from the skew detector 140. In some embodiments, the AND gates 611, 612, 613, 614 may be configured to output high level signals when the delay control signals DLY_T[2:0] are '000', '001', '011', and '111', respectively.

The inverter 621 may operate to invert a logic level of the reference clock CLK. The delay units 622, 623, 624 may be connected in series. The delay unit 622 may receive an output of the inverter 621.

The output circuit 630 may receive the output of the inverter 621. The output circuits 640, 650, 660 may respectively receive outputs of the delay units 622, 623, 624. Each output circuit 630, 640, 650, 660 may include an inverter (631, 641, 651, 661, respectively) and a transmission gate (632/633, 642/643, 652/653, 662/663, respectively). The inverter 631, 641, 651, 661 of each of the output circuits (630, 640, 650, 660, respectively) may receive an output of the respective AND gate (611, 612, 613, 614, respectively) associated therewith. In some embodiments, the output circuits 630, 640, 650, 660 may output the clock signal CLKA1 based on the output of at least one of the inverter 621 and the outputs of the delay units 622, 623, 624 when the output of the respective AND gate (611, 612, 613, 614, respectively) associated therewith is a high level signal.

Delay times of the delay units 622, 623, 624 may correspond to those of the delay units 231, 232, 233 illustrated in FIG. 4. For example, if the delay control signal DLY_T[2:0] is '000', there is no need to correct a clock skew because a pulse width of the pulse signal P_DLY is 30 ps. In this case, the output circuit 630 may generate the clock signal CLKA1 based on the logic inverse of the reference clock signal CLK output by the inverter 621.

If the delay control signal DLY_T[2:0] is set to '001', a clock skew may be corrected because a pulse width of the pulse signal P_DLY may range from 30 ps and 60 ps. In this case, the AND gate 612 may output a high level signal and the output circuit 640 may generate the clock signal CLKA1 that is delayed by the delay unit 622. A delay time by the delay unit 622 may be designed so as to correct the delay time of about 30 ps to about 60 ps between the first and second output clocks CLKOUT1 and CLKOUT2. In some embodiments, the delay adjuster 110 and the delay chain 230 may include a same number (n) of delay units. For example, as shown in the exemplary embodiment illustrated in FIG. 4, the delay chain 230 may include three (3) of the delay units 231, 232, 233 and the delay adjuster may include three (3) delay units 622, 623, 624.

Accordingly, if there is a skew and the first output clock CLKOUT1 of the clock mesh 130 is earlier than the second output clock CLKOUT2, embodiments enable the skew to be corrected by adjusting a delay time of the clock signal CLKA1 to be supplied to the clock mesh 130.

Figure 8:
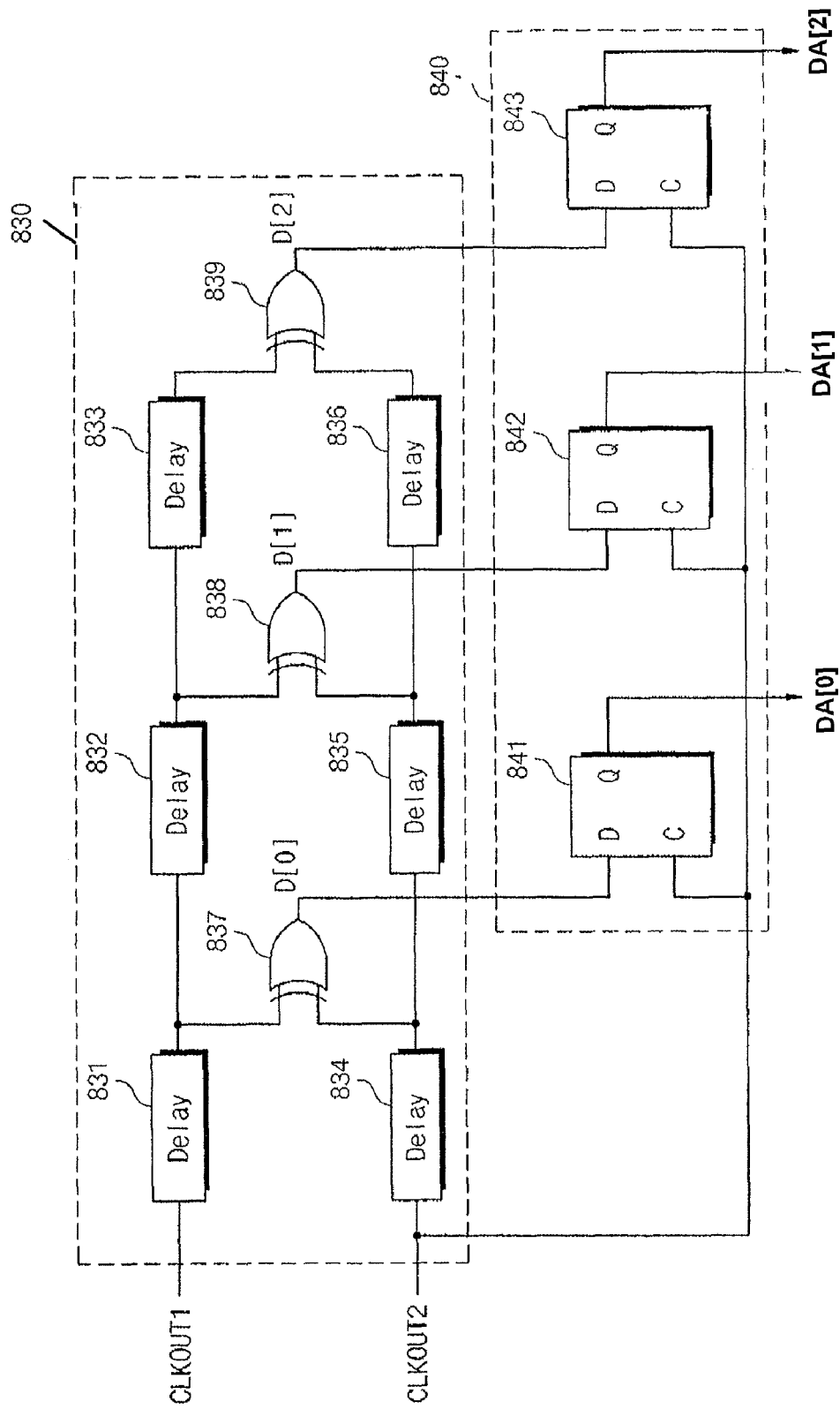
FIG. 8 illustrates a circuit diagram of a delay detector and a latch circuit according to another exemplary embodiment of the invention.

FIG. 8 illustrates a circuit diagram of a delay detector 830 and a latch circuit 840 according to another exemplary embodiment of the invention. More particularly, the delay detector 830 may correspond to the pulse generator 210 and the delay chain 230 of the exemplary embodiment illustrated in FIG. 2, and the latch circuit 840 may correspond to the pulse width detector 240 of the exemplary embodiment illustrated in FIG. 2.

The delay detector 830 may include delay units 831, 832, 833, 834, 835, 836 and exclusive-OR (XOR) gates 837, 838, 839. In some embodiments, the delay detector 830 may include 2 n number of delay units and n XOR gates. The delay units 831, 832, 833 may be connected in series. The delay unit 831 may receive the first output clock CLKOUT1. The delay units 834, 835, 836 may be connected in series. The delay unit 834 may receive the second output clock CLKOUT2. The XOR gate 837 may receive outputs of the delay units 831 and 834, and may output the delay signal D[0]. The XOR gate 838 may receive outputs of the delay units 832 and 835, and may output the delay signal D[1]. The XOR gate 839 may receive outputs of the delay units 833 and 836, and may output the delay signal D[2].

The latch circuit 840 may include D-flipflops 841, 842, 843. In some embodiments, the latch circuit 840 may include n D-flipflops. D-flipflops 841, 842, 843 may latch outputs of the XOR gates 837, 828, 839, respectively, in sync with the second output clock CLKOUT2, and may output the first signals DA[2:0].

According to such structures of the delay detector 830 and the latch circuit 840, the first signals DA[2:0] may be output as digital signals corresponding to delay times of the first and second output clocks CLKOUT1 and CLKOUT2.

Figure 9:
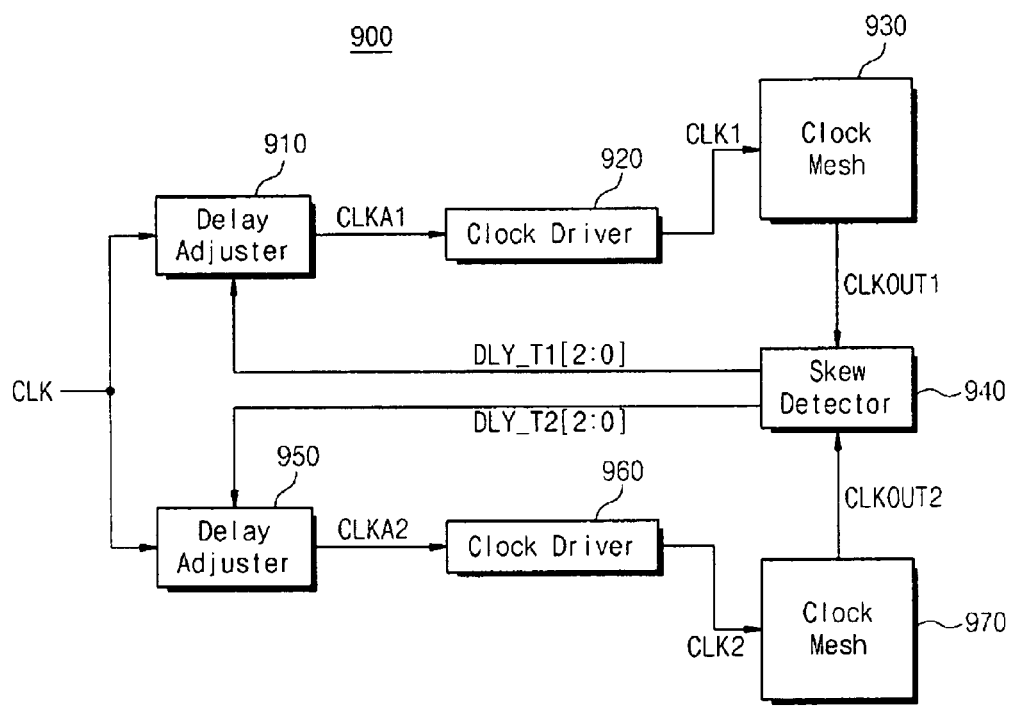
FIG. 9 illustrates a block diagram of an integrated circuit according to another exemplary embodiment of the invention.

FIG. 9 illustrates a block diagram of an integrated circuit 900 according to another exemplary embodiment of the invention.

Referring to FIG. 9, the integrated circuit 900 may include a clock skew controller that includes delay adjusters 910 and 950, clock drivers 920 and 960, a skew detector 940, and a clock meshes 930 and 970.

The skew detector 940 may output a first delay control signal DLY_T1[2:0] corresponding to a delay between the first and second output clocks CLKOUT1 and CLKOUT2 when the first output clock CLKOUT1 of the clock mesh 930 is earlier than the second output clock CLKOUT2 of the clock mesh 970. On the other hand, the skew detector 940 may output a second delay control signal DLY_T2[2:0] corresponding to a delay between the first and second output clocks CLKOUT1 and CLKOUT2 when the second output clock CLKOUT2 is earlier than the first output clock CLKOUT1. Thus, the skew detector 940 may include functional structure(s) to output the second delay control signal DLY_T2[2:0] as well as the first delay control signal DLY_T2[2:0].

The delay adjuster 910 may operate to adjust a delay rate of a clock signal CLKA1 in response to the first delay control signal DLY_T1[2:0]. The delay adjuster 950 may operate to adjust a delay rate of a clock signal CLKA2 in response to the second delay control signal DLY_T2[2:0].

Embodiments of the invention enable detection of a skew between a plurality of clock meshes and adjustment of delay rates of the clocks, which may be supplied to the clock meshes, by a delay time corresponding to the detected skew. Therefore, embodiments enable a clock skew between or among a plurality of clock meshes to be reduced and/or minimized.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A clock skew controller adapted to adjust a skew between a first clock, which is input to a first clock mesh, and a second clock mesh input to a second clock mesh, the clock skew controller comprising:
   a pulse generator configured to output a pulse signal corresponding to a delay time between a first output clock output from the first clock mesh and a second output clock output from the second clock mesh;
   a pulse width detector operatively connected to the pulse generator and configured to generate a digital signal corresponding to a pulse width of the pulse signal;
   a phase detector configured to activate a detection signal when the first output clock is earlier than the second output clock in phase;
   a register circuit configured to store the digital signal in sync with the detection signal;
   a delay control signal generator configured to output a delay control signal in sync with the detection signal; and
   a clock delay adjuster operatively connected to the delay control signal generator and configured to delay the first clock by a time corresponding to the delay control signal.

2. The clock skew controller as claimed in claim 1, wherein the pulse generator comprises:
   a first inverter configured to inverse the second output clock; and
   a logic circuit configured to receive the first output clock and a signal inversed from the second output clock by the first inverter and to output the pulse signal.

3. The clock skew controller as claimed in claim 1, wherein the pulse width detector comprises:
   pluralities of first delay units connected in series, the first delay units delaying the pulse signal; and
   pluralities of first flipflops respectively corresponding to the first delay units, the first flipflops configured to latch corresponding outputs of the first delay units in sync with the pulse signal and to output the digital signal.

4. The clock skew controller as claimed in claim 1, wherein the pulse width detector further comprises:
   pluralities of second flipflops respectively corresponding to the first flipflops, the second flipflops respectively latching corresponding outputs of the first flipflops in sync with the detection signal.

5. The clock skew controller as claimed in claim 4, wherein the pulse width detector further comprises:
   pluralities of third flipflops respectively corresponding to the second flipflops, the third flipflops respectively latching corresponding outputs of the second flipflops in sync with the detection signal.

6. The clock skew controller as claimed in claim 5, wherein each of the second flipflops is associated with a corresponding one of the third flipflops to form corresponding pairs of the second and third flipflops, and the clock skew controller further comprises:
   pluralities of comparators respectively corresponding to the pairs of the second and third flipflops, each of the comparators being configured to output a comparison signal based on whether the outputs of the corresponding second flipflops are identical to outputs of the corresponding third flipflops; and
   pluralities of fourth flipflops respectively corresponding to the comparators, the fourth flipflops respectively latching corresponding outputs of the comparators in sync with the detection signal.

7. The clock skew controller as claimed in claim 6, wherein the clock delay adjuster delays the first clock by a time corresponding to the digital signal.

8. The clock skew controller as claimed in claim 7, wherein the clock delay adjuster comprises:
   a selection signal generator configured to output pluralities of selection signals corresponding to signals output from the fourth flipflops;
   pluralities of second delay units connected in series, each second delay unit being adapted to delay a reference clock; and
   a clock delay selector configured to receive delayed signals of the reference clock output from the second delay units, and configured to output the first clock based on one of the reference clock and the delayed signals output from the second delay units according to the selection signals.

9. The clock skew controller as claimed in claim 8, wherein the second delay units correspond to the first delay units in delay times.

10. The clock skew controller as claimed in claim 1, wherein the phase detector comprises:
    a PMOS transistor connected between a power source voltage and a first node and controlled by the first output clock;
    a second inverter logically inversing the second output clock;
    a first NMOS transistor connected between the first node and a second node and controlled by an output of the second inverter;
    a second NMOS transistor connected between the second node and a ground voltage and controlled by the first output clock;
    a delay circuit delaying the output of the second inverter;
    a flipflop latching a signal inversed from an output of the first node in sync with an output of the delay circuit; and
    a logic circuit adapted to receive an output of the flipflop and the second output clock, and to output the detection signal.

11. An integrated circuit, comprising:
    a first clock mesh receiving a first clock;
    a second clock mesh receiving a second clock;
    a pulse generator configured to output a pulse signal corresponding to a delay time between a first output clock output from the first clock mesh and a second output clock output from the second clock mesh;
    a pulse width detector operatively connected to the pulse generator and configured to generate a digital signal corresponding to a pulse width of the pulse signal;
    a phase detector configured to activate a detection signal when the first output clock is earlier than the second output clock in phase;
    a register circuit configured to store the digital signal in sync with the detection signal;
    a delay control signal generator configured to output a delay control signal in sync with the detection signal; and
    a clock delay adjuster operatively connected to the pulse generator and configured to delay the first clock by a time corresponding to the digital signal.

12. The integrated circuit as claimed in claim 11, wherein the pulse generator comprises:
    a first inverter adapted to inverse the second output clock; and
    a logic circuit adapted to receive the first output clock and a signal inversed from the second output clock by the first inverter and to output the pulse signal.

13. The integrated circuit as claimed in claim 11, wherein the pulse width detector comprises:
    pluralities of first delay units connected in series, delaying the pulse signal; and
    pluralities of first flipflops respectively corresponding to the first delay units, the first flipflops configured to latch corresponding outputs of the first delay units in sync with the pulse signal, and to output the digital signal.

14. An integrated circuit, comprising:
    a first clock mesh receiving a first clock;
    a second clock mesh receiving a second clock;
    a delay detector operatively connected to the first clock mesh and the second clock mesh and configured to output a digital signal in correspondence with a delay time between a first output clock output from the first clock mesh and a second output clock output from the second clock mesh; and
    a clock delay adjuster operatively connected to the delay detector and configured to delay one of the first and second clocks by a time corresponding to the digital signal, wherein the delay detector is adapted to output a first delay control signal corresponding to the delay time between the first output clock and the second output clock when the first output clock is earlier than the second output clock and to output a second delay control signal corresponding to the delay time between the first output clock and the second output clock when the second output clock is earlier than the first output clock, and the clock delay adjuster includes a first clock delay adjuster adapted to delay the first clock by a time corresponding to the first delay control signal and a second clock delay adjuster adapted to delay the second clock by a time corresponding to the second delay control signal.

15. The integrated circuit as claimed in claim 14, wherein the delay detector comprises:

pluralities of first delay units connected in series, receiving the first output clock;

pluralities of second delay units serially connected in correspondence with the first delay units, receiving the second output clock;

pluralities of logic gates adapted to respectively output corresponding delay signals from outputs of the first and second delay units; and pluralities of flipflops respectively latching corresponding signals output from the logic gates in response to the second output clock.

* * * * *